(12) United States Patent
Bae et al.

(10) Patent No.: US 8,324,111 B2
(45) Date of Patent: Dec. 4, 2012

(54) LIQUID CRYSTAL DISPLAY DEVICE AND METHOD FOR FABRICATING THE SAME

(75) Inventors: Jong-Uk Bae, Seoul (KR); Hyun-Sik Seo, Gyeonggi-Do (KR); Im-Kuk Kang, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 206 days.

(21) Appl. No.: 12/849,405

(22) Filed: Aug. 3, 2010

(65) Prior Publication Data

US 2011/0108832 A1    May 12, 2011

(30) Foreign Application Priority Data

Nov. 10, 2009   (KR) .................. 10-2009-0108225

(51) Int. Cl.
*H01L 21/308* (2006.01)
(52) U.S. Cl. .......... 438/740; 438/149; 438/479; 257/59; 257/66; 257/72; 257/E21.231; 257/E21.233
(58) Field of Classification Search ............... 438/142, 438/149, 151, 158, 197, 479, 738, 740; 257/59, 257/66, 72, 288, E21.231, E21.233
See application file for complete search history.

(56) References Cited

U.S. PATENT DOCUMENTS

2002/0084465 A1 * 7/2002 Green et al. ............... 257/91
* cited by examiner

*Primary Examiner* — Eduardo A Rodela
(74) *Attorney, Agent, or Firm* — Morgan, Lewis & Bockius LLP (57) ABSTRACT

Disclosed are a liquid crystal display device employing an amorphous zinc oxide-based semiconductor as an active layer, and a method for fabricating the same, whereby device stability can be secured by employing an etch stopper structure and device characteristics can be enhanced by minimizing exposure and deterioration of the active layer excluding content regions by virtue of the design of the etching stopper in a shape like "H". Also, the liquid crystal display device and the fabrication method thereof can further form a semiconductor pattern and an insulating layer pattern on the intersection between the gate line and the data line, so as to compensate a stepped portion, thereby preventing an occurrence of short-circuit.

16 Claims, 13 Drawing Sheets

LIQUID CRYSTAL DISPLAY DEVICE AND METHOD FOR FABRICATING THE SAME

CROSS-REFERENCE TO A RELATED APPLICATION

Pursuant to 35 U.S.C. §119(a), this application claims the benefit of earlier filing date and right of priority to Korean Application 10-2009-0108225, filed on Nov. 10, 2009, the content of which is incorporated by reference herein in its entirety.

BACKGROUND OF THE INVENTION

1. Field of the Invention

The present invention relates to a liquid crystal display (LCD) device and a fabrication method thereof, and particularly, to an LCD device using an amorphous zinc oxide-based semiconductor as an active layer and a fabrication method thereof.

2. Description of the Related Art

Recently, as information displaying becomes more attractive and demands on the use of portable information media increase, researches and commercialization of light and thin flat panel displays (FPDs), which substitute cathode ray tubes (CRTs) as the existing display devices, have been broadly increased. Especially, among the FPDs, liquid crystal display (LCD) devices are to display images by using optical anisotropic property of liquid crystal. The LCD devices exhibit excellent resolution, color rendering property, image quality and the like, so they are widely applied to laptop computers, desktop monitors and the like.

The LCD device includes a color filter substrate, an array substrate, and a liquid crystal layer interposed between the color filter substrate and the array substrate.

An active matrix (AM) driving method, which is commonly used for the LCD device, is a method in which liquid crystal molecules in a pixel part are driven by using amorphous silicon thin film transistors (a-Si TFTs) as switching devices.

Hereinafter, a structure of a related art LCD device will be described in detail with reference to FIG. 1.

Figure 1:
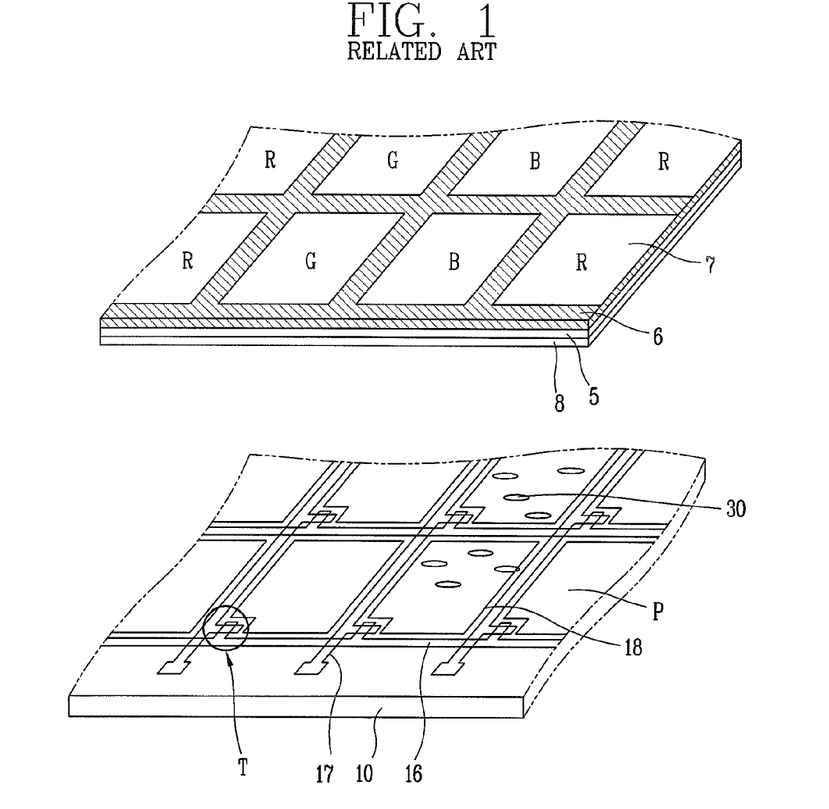
FIG. 1 is a disassembled perspective view schematically showing a related art LCD device.

FIG. 1 is a disassembled perspective view schematically showing a related art LCD device.

As shown in FIG. 1, the LCD device includes a color filter substrate 5, an array substrate 10, and a liquid crystal layer 30 interposed between the color filter substrate 5 and the array substrate 10.

The color filter substrate 5 is provided with a color filter C having a plurality of sub color filters 7 for rendering red (R), green (G) and blue (B) colors, a black matrix 6 for dividing between adjacent sub color filters 7 and blocking light transmission through the liquid crystal layer 30, and a transparent common electrode 8 for applying a voltage to the liquid crystal layer 30.

Also, the array substrate 10 is provided with a plurality of gate lines 16 and data lines 17 arranged horizontally and vertically for defining a plurality of pixel regions P, thin film transistors T as switching devices formed at intersections between the gate lines 16 and the data lines 17, and pixel electrodes 18 formed on the respective pixel regions P.

The color filter substrate 5 and the array substrate 10 having such structure are attached in a facing manner by a sealant (not shown) formed at an edge of an image display region, thereby constituting an LC panel. The attachment between the color filter substrate 5 and the array substrate 10 may be implemented by an attachment key (not shown) formed either at the color filter substrate 5 or at the array substrate 10.

The amorphous silicon thin film transistor used for the above-described LCD may be fabricated in a low temperature process, but its mobility is small and does not satisfy constant current bias conditions. Meanwhile, a polycrystalline silicon thin film transistor has high mobility and satisfies the constant current bias conditions, but it is difficult to secure uniform characteristics, so it is difficult to increase in area and a high temperature process is required.

Thus, an oxide semiconductor thin film transistor including an active layer as oxide semiconductor has been developed, but application of the oxide semiconductor to the thin film transistor of the bottom gate structure causes degeneration of the oxide semiconductor during an etching process of source and drain electrodes.

Figure 2:
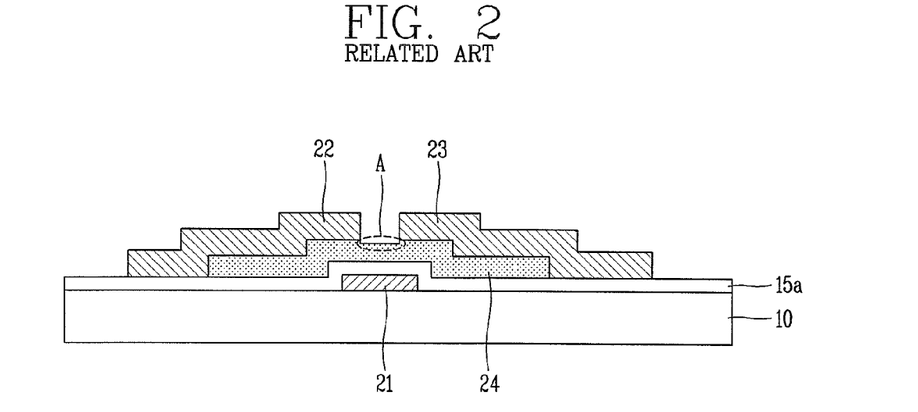
FIG. 2 is a sectional view schematically showing the structure of a related art oxide thin film transistor.

FIG. 2 is a sectional view schematically showing the structure of a related art oxide thin film transistor.

As illustrated, in the related art oxide TFT structure, a gate electrode 21 and a gate insulating layer 15a are formed on the substrate 10, and an active layer 24 formed of oxide semiconductor is formed on the gate insulating layer 15a.

Thereafter, source and drain electrodes 22 and 23, which electrically contact with source and drain regions of the active layer 24, are formed on the active layer 24, and at this time, in the process of depositing and etching the source and drain electrodes 22 and 23, the lower active layer 24 (in particular, a channel region A of the active layer 24) is possibly damaged to be degenerated, deteriorating the reliability of the device.

Namely, metals for source and drain electrodes are restrained to molybdenum based metals in consideration of contact resistance with oxide semiconductor. When the source and drain electrodes are formed according to a wet etching, the active layer is lost or damaged due to the physical properties of the oxide semiconductor which is weak to an etchant. Also, even when the source and drain electrodes are formed according to a dry etching, back sputtering or oxygen deficiency of the oxide semiconductor causes the active layer to be degenerated.

As such, since the oxide semiconductor has a weak coupling structure, in order to prevent damages on the back channel region due to the succeeding processes after deposition of the oxide semiconductor, an etch stopper may further be formed on the active layer as a barrier layer. However, for the oxide semiconductor, there is no consideration of preventing deterioration of device characteristics due to processes excluding a dry etching, namely, due to stripping or other environmental exposures.

Also, on the region where the gate line and the data line intersect each other, the gate insulation layer is deposited thinner on an upper portion of the gate line than on a side surface of the gate line, thereby generating a stepped portion, resulting in occurrence of a defect, such as a short-circuit between the gate line and the data line, on the side surface of the gate line.

SUMMARY OF THE INVENTION

Therefore, an object of the present invention is to provide a liquid crystal display (LCD) device which uses an amorphous zinc oxide-based semiconductor as an active layer, and a fabrication method thereof.

Another object of the present invention is to provide an LCD device capable of ensuring device stability by employing an etch stopper structure and simultaneously improving device characteristics by minimizing exposure and deterioration of an active layer, and a fabrication method thereof.

Another object of the present invention is to provide an LCD device capable of preventing a short-circuit defect from occurring on an intersection between a gate line and a data line.

The foregoing and other objects, features, aspects and advantages of the present invention will become more apparent from the following detailed description of the present invention when taken in conjunction with the accompanying drawings.

To achieve these and other advantages and in accordance with the purpose of the present invention, as embodied and broadly described herein, there is provided a liquid crystal display device including a gate electrode and a gate line formed on an array substrate, a gate insulating layer formed on the array substrate with the gate electrode and the gate line formed thereon, an active layer formed on the gate electrode having the gate insulating layer formed thereon, the active layer made of an amorphous zinc oxide-based semiconductor, an etch stopper formed on the active layer in a shape like "H", the etch stopper obscuring the active layer excluding a contact region, a data line formed on the active layer to define a pixel region by intersecting with the source and drain electrodes and the gate line electrically connected to the contact region of the active layer, a passivation layer formed on the array substrate with the source and drain electrodes and the data line formed thereon, a contact hole formed by removing a partial region of the passivation layer to expose a part of the drain electrode, a pixel electrode electrically connected to the drain electrode via the contact hole, and a color filter substrate attached to the array substrate to face each other.

In accordance with one embodiment of the present invention, there is provided a method for fabricating a liquid crystal display device, the method including forming a gate electrode and a gate line on an array substrate, forming a gate insulating layer on the array substrate with the gate electrode and the gate line formed thereon, forming an active layer on the gate electrode having the gate insulating layer formed thereon, the active layer made of an amorphous zinc oxide-based semiconductor, forming an etch stopper in a shape like "H" on the active layer, the etch stopper obscuring the active layer excluding contact region, forming source and drain electrodes on the active layer, the source and drain electrodes being electrically connected to the contact region of the active layer, and forming a data line defining a pixel region by intersecting with the gate line, forming a passivation layer on the array substrate having the source and drain electrodes and the data line formed thereon, forming a contact hole for exposing a part of the drain electrode by removing a partial region of the passivation layer, forming a pixel electrode, the pixel electrode being electrically connected to the drain electrode via the contact hole, and attaching the array substrate and a color filter substrate in a facing manner.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of a liquid crystal display (LCD) device and a fabrication method thereof in accordance with the preferred embodiments of the present invention, with reference to the accompanying drawings.

Figure 3:
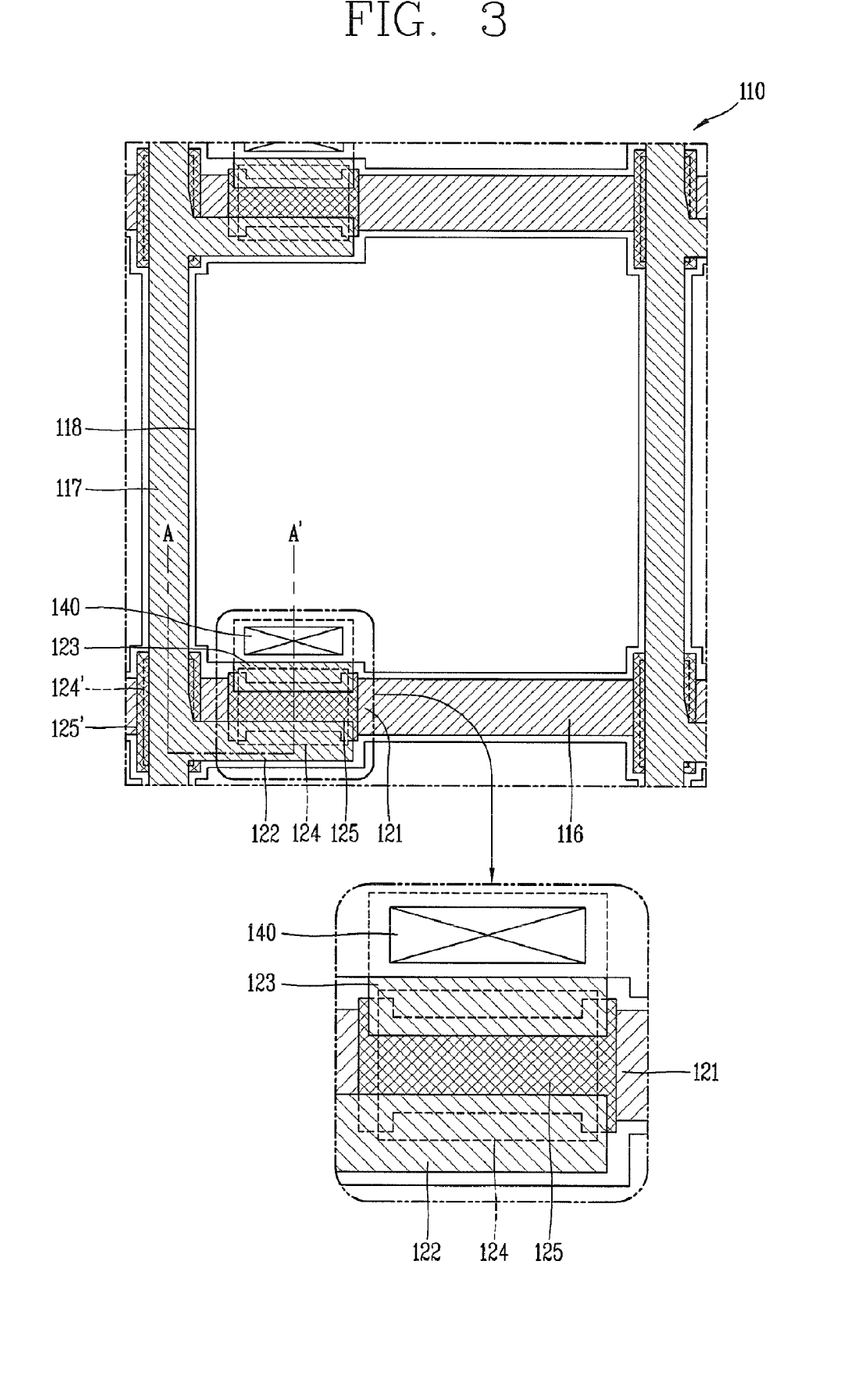
FIG. 3 is a planar view schematically showing a part of an array substrate of an LCD device in accordance with an embodiment of the present invention.

FIG. 3 is a planar view schematically showing a part of an array substrate of an LCD device in accordance with an embodiment of the present invention, which schematically shows an oxide think film transistor (TFT) array substrate on which amorphous zinc oxide-based semiconductor constitutes an active layer.

Figure 4:
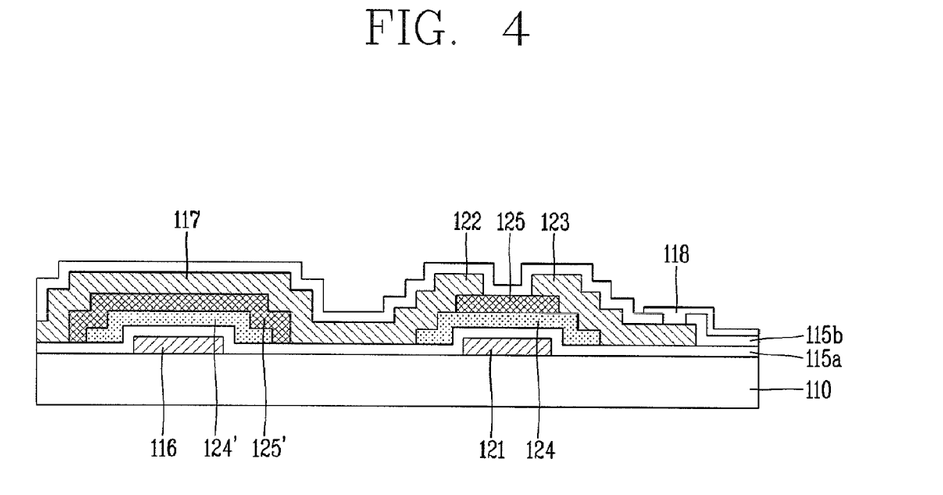
FIG. 4 is a sectional view schematically showing the part of the array substrate of the LCD device in accordance with the embodiment of the present invention.

Also, FIG. 4 is a sectional view schematically showing the part of the array substrate of the LCD device in accordance with the embodiment of the present invention, which schematically shows a section taken along the line A-A' of the array substrate shown in FIG. 3.

Here, FIGS. 3 and 4 show one pixel including a thin film transistor (TFT) of a pixel part for the sake of brief description although an actual LCD device includes M×N pixels generated at intersections between N gate lines and M data lines.

Also, the embodiment exemplarily shows a twisted nematic (TN) type LCD device, but may not be limited to the type. Alternatively, the present invention may be applicable to an in plane switching (IPS) type LCD device.

As shown, an array substrate 110 in accordance with the embodiment of the present invention includes gate lines 116 aligned longitudinally and horizontally on the array substrate 110 for defining pixel regions. An oxide TFT as a switching device is formed at an intersection between the gate line 116 and the data line 117. A pixel electrode 118, which is connected to the oxide TFT so as to drive a liquid crystal layer (not shown) together with a common electrode of a color filter substrate (not shown), is formed on each pixel region.

The oxide TFT in accordance with the embodiment of the present invention includes a gate electrode 121 constituting a part of the gate line 116, a source electrode 122 connected to the data line 117, and a drain electrode 123 connected to the pixel electrode 118 via a contact hole 140. Also, the oxide TFT further includes an active layer 124 made of an amorphous zinc oxide (ZnO) based semiconductor, which forms a conductive channel between the source electrode 122 and the drain electrode 123 by a gate voltage applied to the gate electrode 121.

Here, the reference numerals 115a and 115b denote a gate insulating layer and a passivation layer, respectively.

Thus, because the oxide TFT according to the embodiment of the present invention has the active layer made of the amorphous zinc oxide (ZnO) based semiconductor, high mobility and constant current test conditions are met and uniform characteristics are secured, sot the oxide TFT can be applicable to a large-scale display.

The zinc oxide is a material which can realize three properties of conductivity, semiconductor characteristics and resistance, depending on oxygen content. Consequently, the oxide TFT which employs the amorphous zinc oxide based semiconductor material as the active layer can be applied to large-scale display devices including the LCD devices and organic electroluminescence display devices.

Also, enormous interests and activities are concentrated on a transparent electronic circuit in recent time. The oxide TFT, which employs the amorphous zinc oxide based semiconductor material as the active layer, has the high mobility and can be fabricated at a low temperature, so it can be employed for the transparent electronic circuit.

Especially, the oxide TFT according to the embodiment of the present invention is characterized by forming the active layer using a-IGZO semiconductor which contains heavy metal, such as indium (In) and gallium (Ga) in ZnO.

The a-IGZO semiconductor is transparent, allowing visible rays to transmit therethrough. Also, the oxide TFT fabricated with the a-IGZO semiconductor exhibits high mobility of 1~100 cm$^2$/Vs, as compared with the amorphous silicon TFT.

The a-IGZO semiconductor has wide band gap, so it can be used for fabricating a UV light emitting diode (LEDs) having high color purity, a white LED and other components. Also, because the a-IGZO semiconductor can be processed at a low temperature, it is advantageous for production of light and flexible products.

Furthermore, the oxide TFT fabricated with the a-IGZO semiconductor exhibits uniform characteristics similar to the amorphous silicon TFT. Thus, its component structure is simple like the amorphous silicon TFT and thus, the oxide TFT can be applicable to a large-scale display.

In the oxide TFT having such characteristics in accordance with the embodiment of the present invention, an etch stopper 125 which is configured as a certain insulating layer is formed between the source electrode 122 and the drain electrode 123 on a back channel region of the active layer 124. The etch stopper 125 may serve to prevent damages on the back channel region due to the subsequent processes. That is, the etch stopper 125 according to the embodiment of the present invention is formed on the back channel region of the active layer 124, so as to function to prevent the back channel region of the active layer 124 from contacting with chemical substances due to a photolithography process and from being exposed to wet or dry etching and plasma processes during the succeeding processes.

Especially, the etch stopper 125 according to the embodiment of the present invention is designed in a shape like "H", allowing minimization of exposure and deterioration of the active layer 124 excluding a contact region, as compared with the existing structure, thereby improving device characteristics.

That is, upon formation of the etch stopper 125, the design of the contact region for electric connection between the active layer 124 and the source and drain electrodes 122 and 123 has a large effect on processes and device characteristics. With the embodiment of the present invention, however, the etch stopper 125 is formed in the shape like "H" so as to completely protect the active layer 124 excluding the contact region by using an insulating layer, such as a silicon oxide, thereby minimizing the external exposure of the active layer 124. Also, a dry etching as well as a wet etching can be employed for etching the data wires, namely, the source and drain electrodes 122 and 123 and the data line 117. A partial etching of the etch stopper 125 on the contact region may derive an effect of giving a degree of freedom in an alignment direction of the source and drain electrodes 122 and 123, and the oxide semiconductor on the contact region is deteriorated during dry etching of the etch stopper 125, which causes a reduction of resistance, thereby improving device characteristics.

Here, in the embodiment of the present invention, the description is given of the case where the source electrode 122 is exemplarily designed in a direction substantially in parallel to the gate line 116. However, the present invention may not be limited to this structure. As aforesaid, the present invention can give the degree of freedom in the alignment direction of the source and drain electrodes 122 and 123.

The active layer 124 may also be configured to have an alignment margin of about 1.5 μm in a longitudinal direction with respect to the lower gate electrode 121. As the contact region of the active layer 124 is formed to overlap with the lower gate electrode 121 with a width of about 1.5 μm, the contact region of the active layer 124 may overlap with the upper source and drain electrodes 122 and 123 with a width of about 3 μm. Also, the "H" shaped etch stopper 125 may overlap with the source and drain electrodes 122 and 123, with a width of about 1.5 μm, on its central portion excluding right and left protruded portions. However, the present invention may not be limited to those numerical values.

The LCD device according to the embodiment of the present invention may further include a semiconductor pattern 124' and an insulating layer pattern 125' formed as the oxide semiconductor and the insulating layer, respectively, on the intersection between the gate line 116 and the data line 117, so as to compensate the stepped portion of the lower gate line 116, thereby preventing an occurrence of the short-circuit defect.

Here, the semiconductor pattern 124' and the insulating layer pattern 125' may be configured to completely obscure the lower gate line 116, and the insulating layer pattern 125' may be configured to completely obscure the lower semiconductor pattern 124' and the gate line 116.

Hereinafter, a method for fabricating the LCD device in accordance with the embodiment of the present invention having the configuration will be described in detail.

FIGS. 5A to 5F are sectional views sequentially showing a fabrication process of the array substrate shown in FIG. 3.

Also, FIGS. 6A to 6F are sectional views sequentially showing a fabrication process of the array substrate shown in FIG. 4.

Figure 5A:
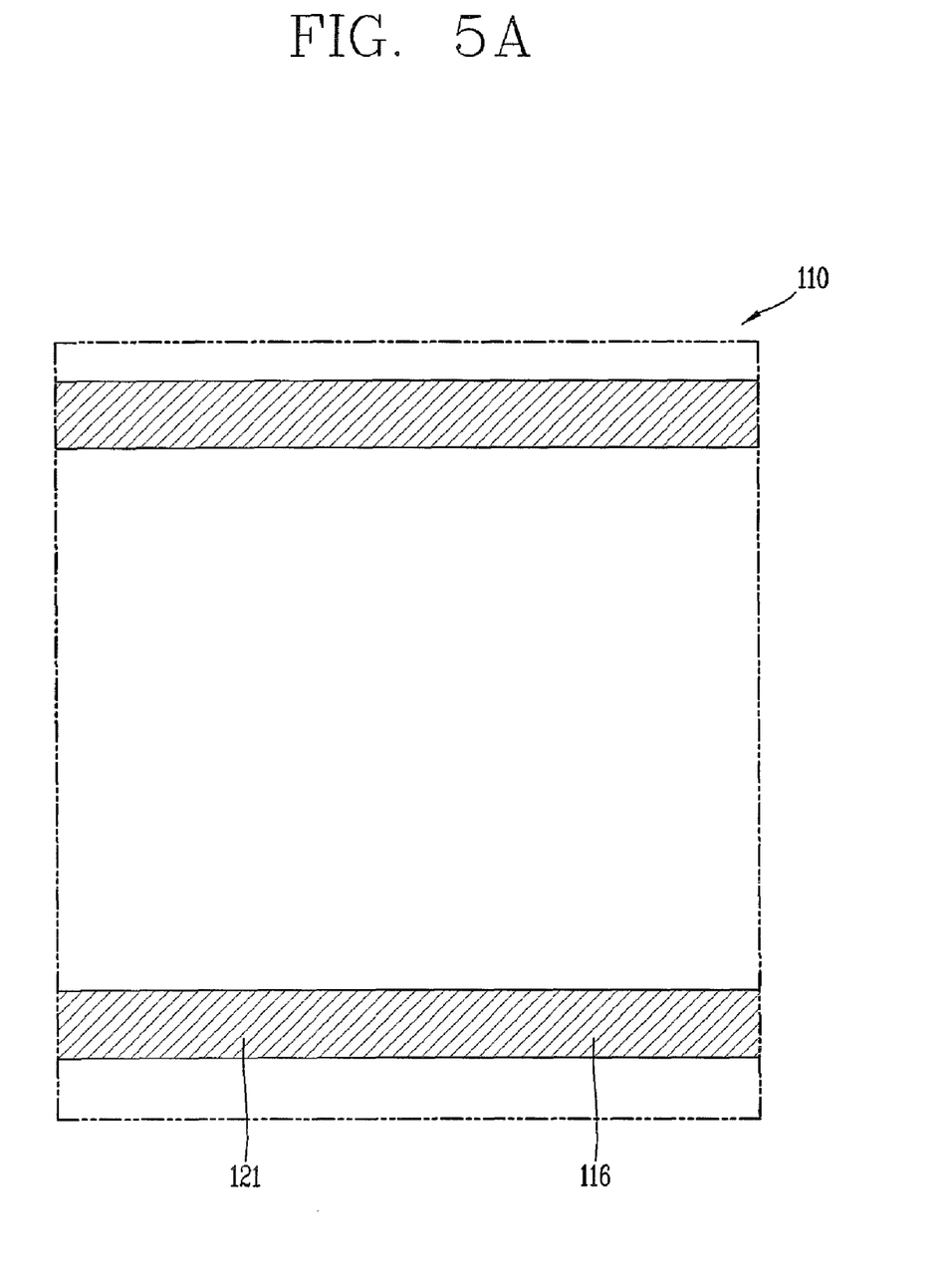
FIGS. 5A to 5F are sectional views sequentially showing a fabrication process of the array substrate shown in FIG. 3.
Figure 6A:
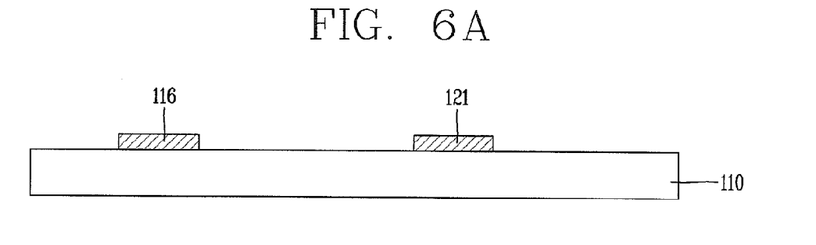
FIGS. 6A to 6F are sectional views sequentially showing a fabrication process of the array substrate shown in FIG. 4.

As shown in FIGS. 5A and 6A, the gate electrode 121 and the gate line 116 are formed on the array substrate 110 which is made of a transparent insulating material.

Here, the amorphous zinc oxide based composite semiconductor which is applied to the oxide TFT according to the present invention, can be deposited at a low temperature, so it can be used for a plastic substrate or a substrate, such as soda lime glass or the like, that can be applicable to a low temperature process. Also, the exhibition of amorphous properties allows the use for a large-scale display substrate.

Also, the gate electrode 121 and the gate line 116 are formed by depositing a first conductive film on the entire surface of the array substrate 110 and selectively patterning the first conductive film via a photolithography (first masking process).

Here, the first conductive film may be made of a low-resistance opaque conductive material, such as aluminum (Al), Al alloy, tungsten (W), copper (C), nickel (Ni), chromium (Cr), molybdenum (Mo), titanium (Ti), platinum (Pt), tantalum (Ta) and the like. Also, the first conductive film may be made of an opaque conductive material, such as indium tin oxide (ITO), indium zinc oxide (IZO) or the like. The first conductive film may be formed with a multi-layered structure by stacking two or more of such materials.

Figure 5B:
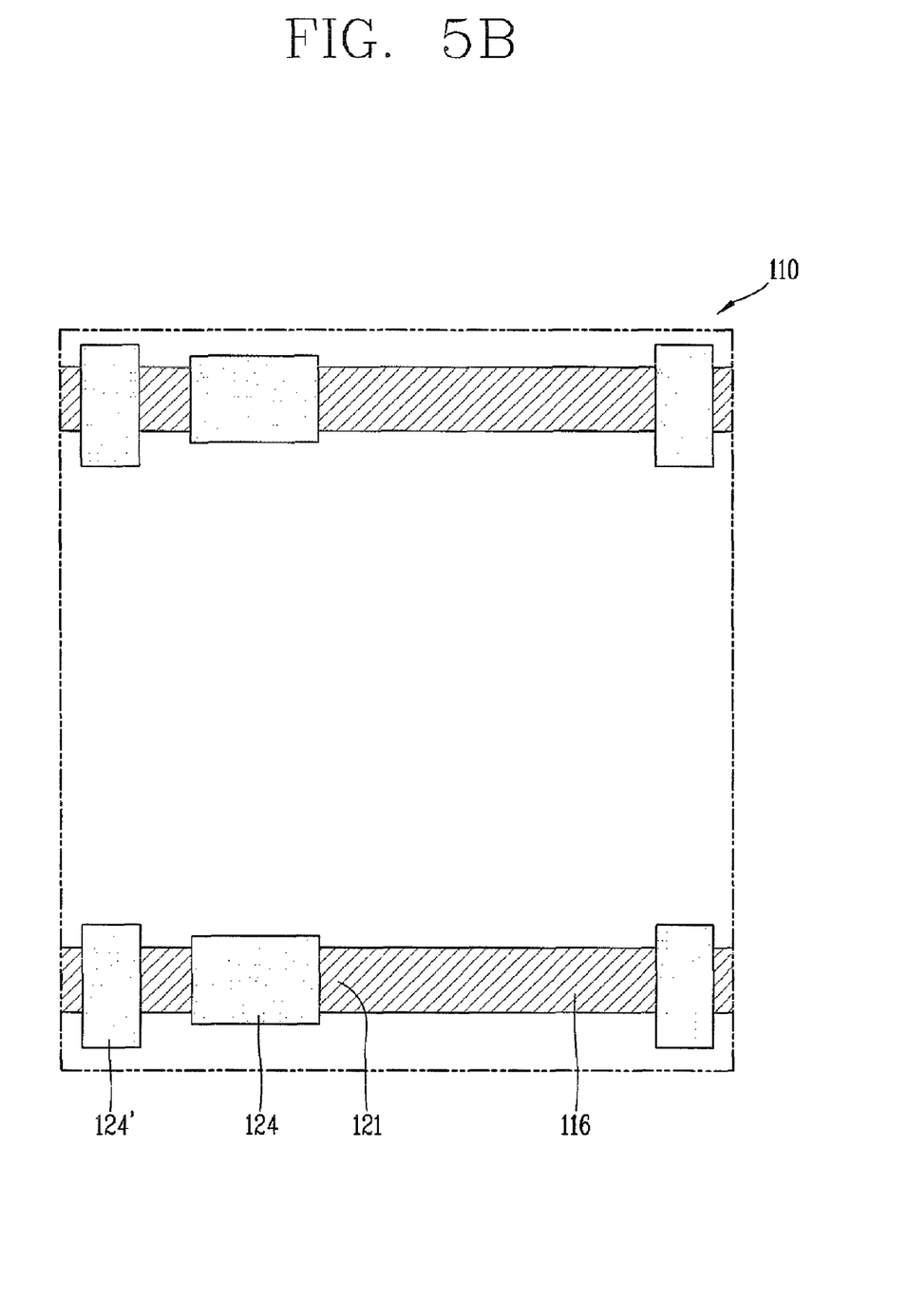
Figure 6B:
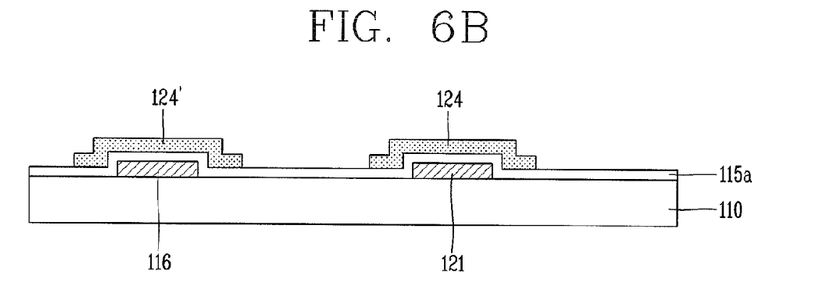

Next, as shown in FIGS. 5B and 6B, an inorganic insulating layer, such as silicon nitride (SiNx) and silicon oxide (SiO$_2$) or a gate insulating layer 115a made of high dielectric oxide, such as hafnium (HF) oxide or aluminum oxide is formed on the entire surface of the array substrate 110 having the gate electrode 121 and the gate line 116.

Here, the gate insulating layer 115a may be formed by chemical vapor deposition (CVD) using plasma enhanced CVD (PECVD) equipment or physical vapor deposition (PVD) using sputtering equipment. Also, a surface treatment and a thermal treatment may be performed before deposition of the gate insulating layer 115a.

After depositing the amorphous zinc oxide-based semiconductor on the entire surface of the array substrate 110 having the gate insulating layer 115a, the deposited semiconductor undergoes a selective patterning, thereby forming the active layer 124 made of the amorphous zinc oxide-based semiconductor on the gate electrode 121 and simultaneously forming the semiconductor pattern 124' made of the amorphous zinc oxide-based semiconductor on the gate line 116, which is present on the intersection between the gate line 116 and the data line so as to obscure the gate line 116.

Here, the amorphous zinc oxide-based composite semiconductor, especially a-IGZO semiconductor may be formed by a sputtering method using a composite target of gallium oxide (Ga$_2$O$_3$), indium oxide (In$_2$O$_3$) and zinc oxide (ZnO).

Here, the embodiment of the present invention is illustrated such that the amorphous zinc oxide-based semiconductor is deposited with a composite oxide target having atomic ratios of 1:1:1, 2:2:1, 3:2:1 and 4:2:1 of gallium, indium and zinc. For use of the gallium-indium-zinc composite oxide target with the atomic ratio of 2:2:1, the equivalence ratio of gallium, indium and zinc is about 2.8:2.8:1.

The oxide TFT according to the embodiment of the present invention is implemented such that a carrier concentration of the active layer 124 can be adjusted by controlling oxygen concentration within a reactive gas during the sputtering for deposition of the amorphous zinc oxide-based semiconductor. Here, uniform device characteristics can be ensured under the conditions that the oxygen concentration is in the range of 1~10% and a thickness is in the range of 500~1000 Å.

The amorphous ZnO semiconductor according to the embodiment of the present invention may be formed via DC or RF sputtering under conditions of a deposition speed in the range of 1~200 Å/sec and 1~40% oxygen concentration. Here, the oxygen concentration indicates a ratio of oxygen flow to the sum of used oxygen flow and argon flow.

Figure 5C:
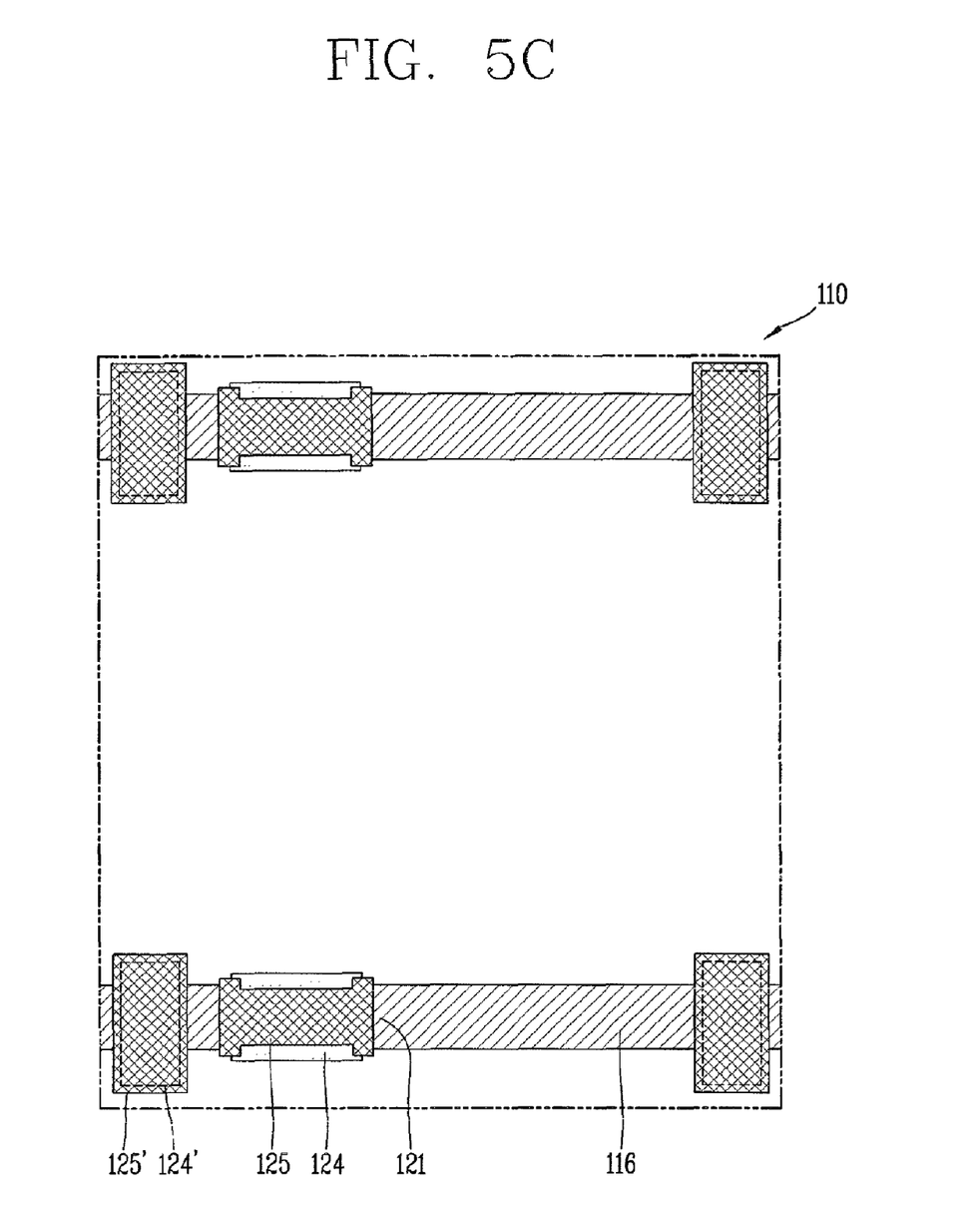
Figure 6C:
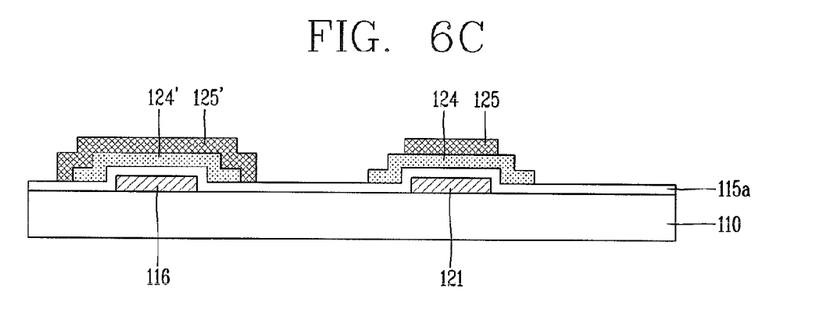

As shown in FIGS. 5C and 6C, after depositing the insulating layer, such as silicon nitride or silicon oxide, on the entire surface of the array substrate 110, the deposited insulating layer undergoes a selective patterning through a third masking process, thereby forming an etch stopper 125 made of the insulating layer on the active layer 124 and simultaneously forming the insulating layer pattern 125' made of the insulating layer on the semiconductor pattern 124'.

Here, the semiconductor pattern 124' and the insulating layer pattern 125' are formed to completely obscure the lower gate line 116. The insulating layer pattern 125' is formed to completely obscure the lower semiconductor pattern 124' and gate line 116, so as to function to compensate a stepped portion of the gate line 116 on the intersection region between the gate line 116 and the data line.

Figure 7:
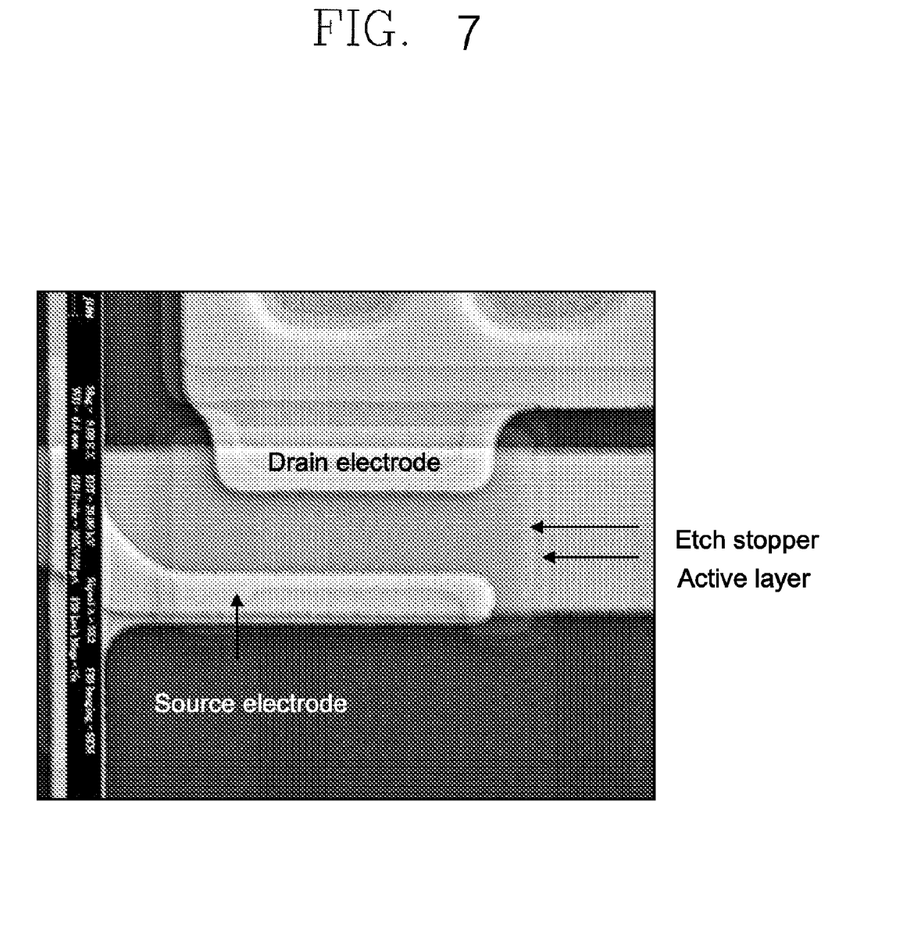
FIG. 7 is a scanning electron microscope (SEM) photo showing the structure of the oxide TFT in accordance with the embodiment of the present invention.

Here, the insulating layer is formed in a thickness ranging from 300 to 4000 Å by using gas containing SiH$_4$ and N$_2$O or SiH$_4$ and NH$_3$. The etch stopper 125 is formed in a shape like "H" due to being etched out at its upper and lower central portions for connection between the active layer 124 and the source and drain electrodes (see FIG. 7). Accordingly, as compared with the existing structure, it is possible to minimize exposure and deterioration of the active layer 124 excluding the contact region, namely, the upper and lower etched portions of the insulating layer pattern 125', resulting in improvement of device characteristics.

That is, upon formation of the etch stopper 125, the design of the contact region for the electric connection between the active layer 125 and the source and drain electrodes has a large effect on processes and device characteristics. In the embodiment of the present invention, the "H" shaped etch stopper 125 is formed to completely protect the active layer 124 excluding the contact region, thereby minimizing the external exposure of the active layer 124. Also, a dry etching as well as a wet etching can be employed for etching of data wires, namely, the source and drain electrodes and the data line. Also, the partial etching of the etch stopper 125 on the contact region can derive an effect of giving a degree of freedom in an alignment direction of the source and drain electrodes. The oxide semiconductor on the contact region is deteriorated during dry etching, accordingly, resistance of the oxide semiconductor is reduced, thereby improving the device characteristics.

In addition, the finally exposed contact region of the active layer 124 further experiences surface treatment and thermal treatment, thereby minimizing resistance.

Figure 8:
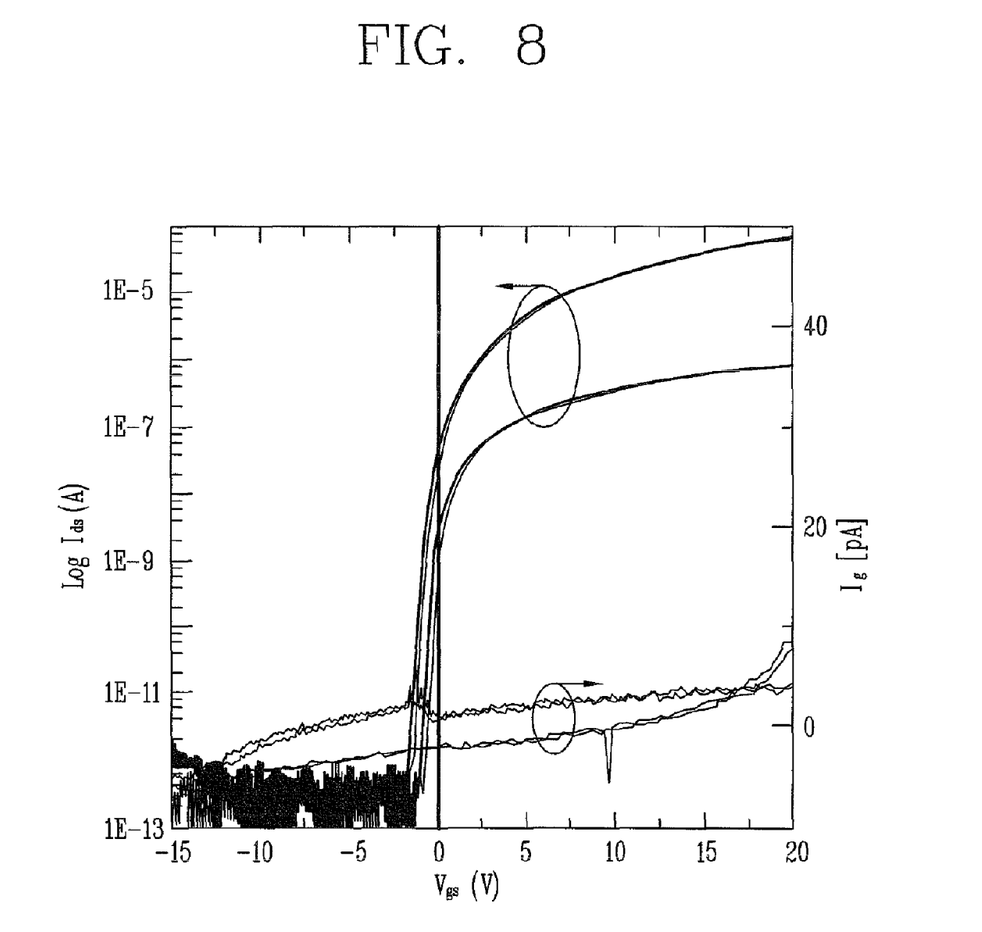
FIG. 8 is a graph showing electric characteristics of the oxide TFT in accordance with the embodiment of the present invention.

Here, FIG. 8 is a graph showing electric characteristics of the oxide TFT in accordance with the embodiment of the present invention.

Here, the left side in the graph exhibits transfer characteristics of the oxide TFT, and the right side in the graph exhibits a current flowing between the source and drain electrodes responsive to a gate voltage. As can be seen in the graph, as a contact resistance decreases, a transfer curve is sharply slanted and the deterioration of the active layer is minimized. Consequently, it can be understood that the device characteristics are excellent without a current leakage.

Figure 5D:
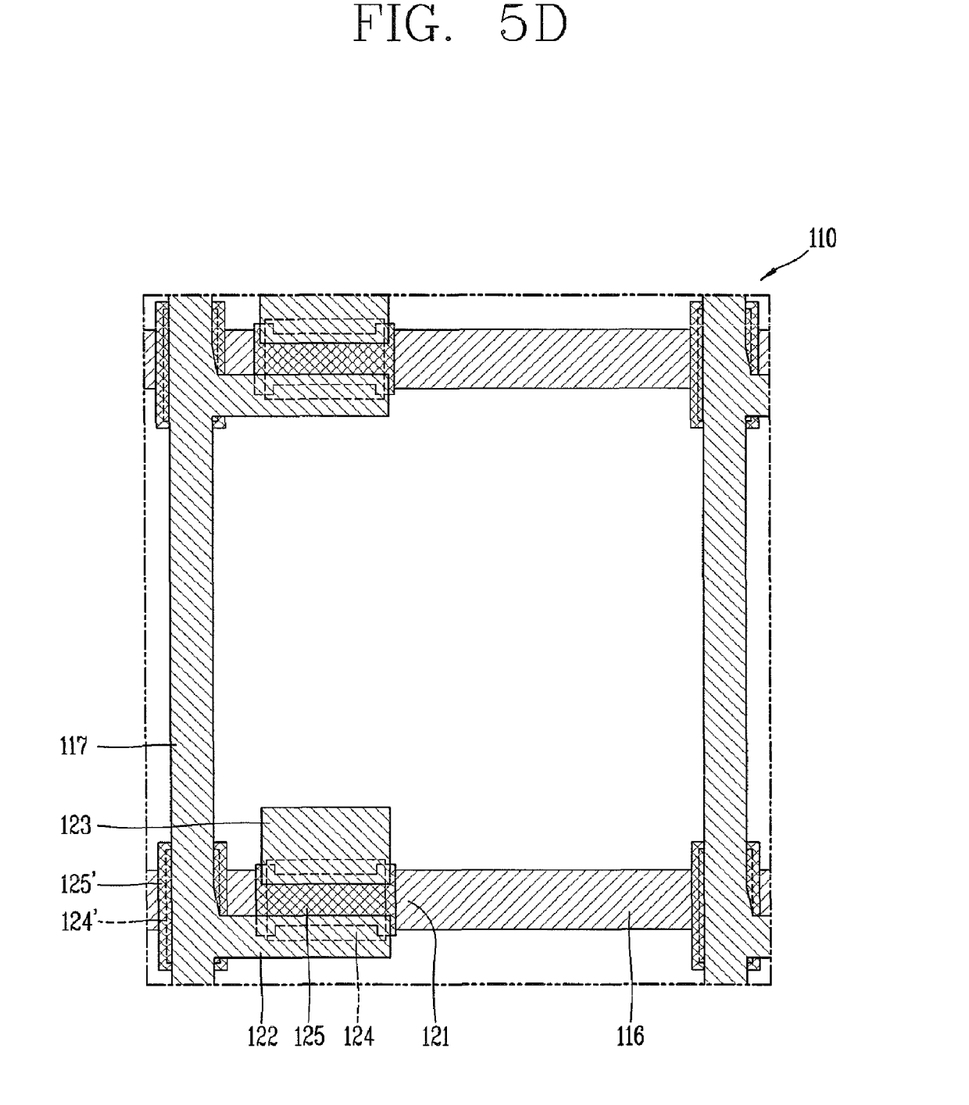
Figure 6D:
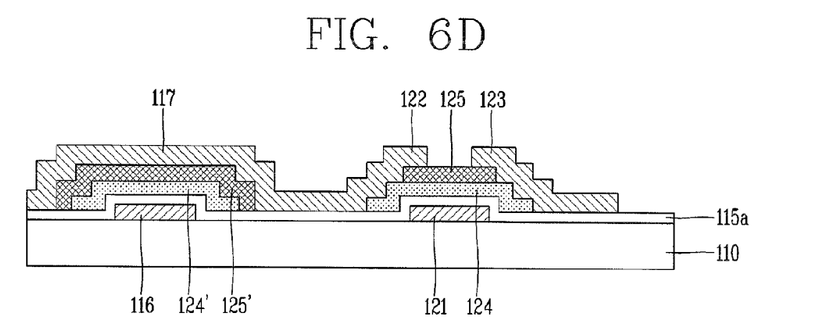

Referring to FIGS. 5D and 6D, a second conductive film is formed on the entire surface of the array substrate 110 having the active layer 124 and the etch stopper 125.

Here, for forming the source and drain electrodes and the data line, a low-resistance opaque conductive material may be employed as the second conductive film. Examples of the low-resistance opaque conductive materials include aluminum (Al), Al alloy, tungsten (W), copper (C), nickel (Ni), chromium (Cr), molybdenum (Mo), titanium (Ti), platinum (Pt), tantalum (Ta) and the like. Also, the first conductive film may be made of an opaque conductive material, such as indium tin oxide (ITO), indium zinc oxide (IZO) or the like. The second conductive film may be formed with a multi-layered structure of stacking two or more of such materials.

Afterwards, the second conductive film is selectively patterned through a photolithography process (4$^{th}$ masking process), thereby forming the source and drain electrodes 122 and 123 which are electrically connected to the contact region of the active layer 124, namely, source and drain regions.

The data line 117, which is configured with the second conductive film and defines a pixel region by intersecting with the gate line 116, is also formed through the 4$^{th}$ masking process.

Figure 5E:
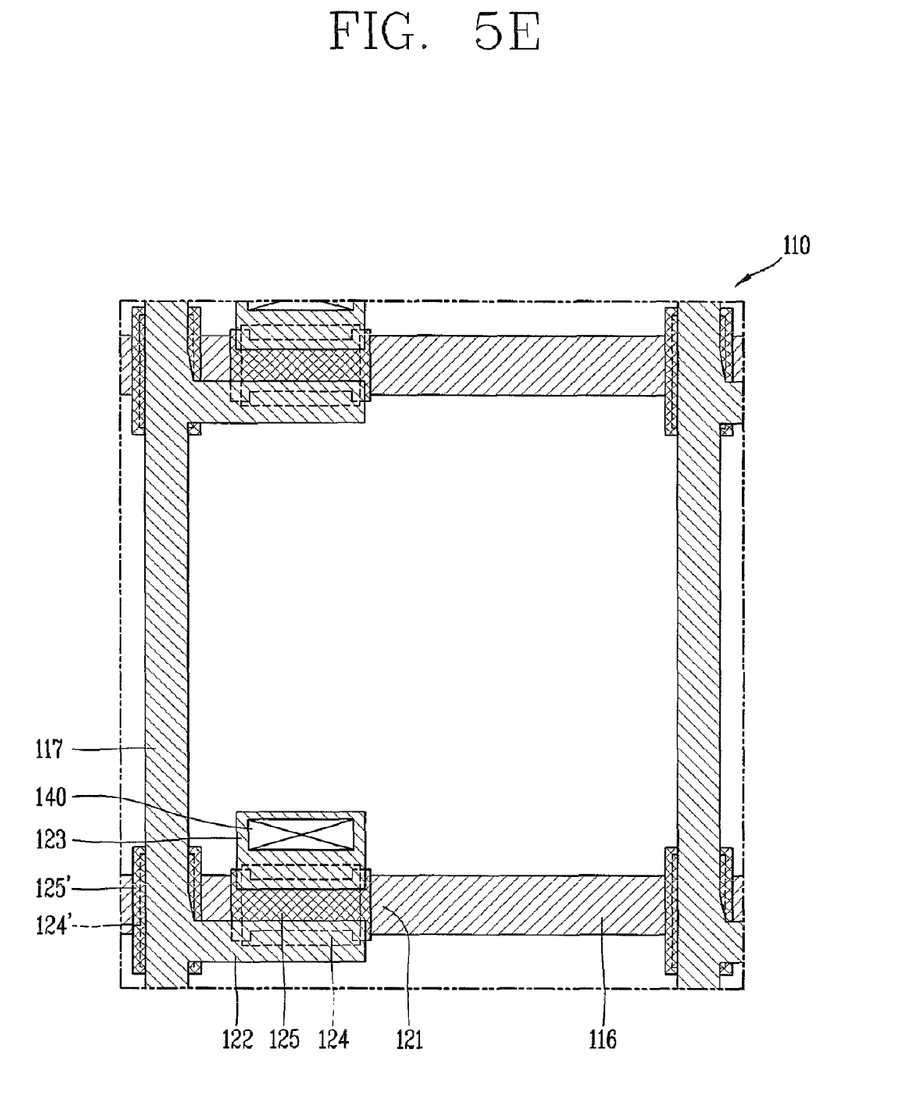
Figure 6E:
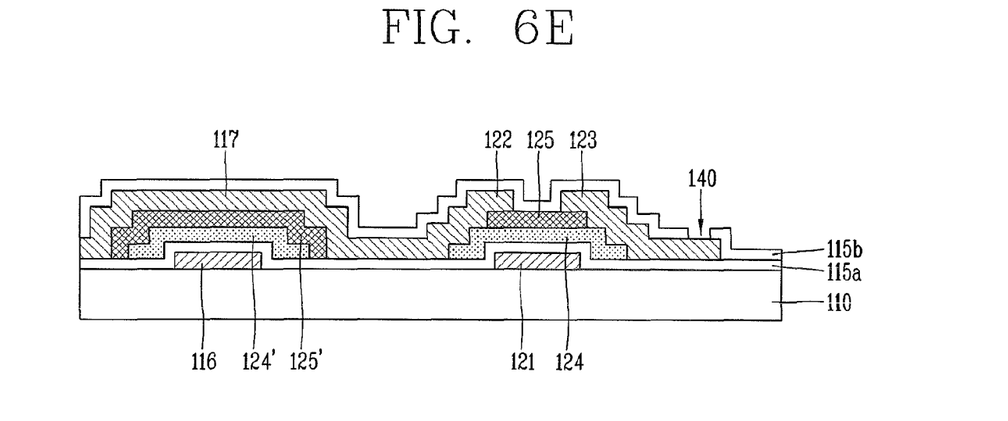

Referring to FIGS. 5E and 6E, a passivation layer 115b is formed on the entire surface of the array substrate 110 having the source and drain electrodes 122 and 123 and the data line 117, and undergoes a photolithography process (5$^{th}$ masking process) to be selectively removed, thereby forming a contact hole 140 for exposing part of the drain electrode 123 on the passivation layer 115b.

Here, the passivation layer 115b may be formed of an inorganic insulating layer, such as silicon nitride or a silicon oxide. Alternatively, the passivation layer 115b may be formed of an organic insulating layer, such as photoacryl or benzocyclobutene (BCB).

Figure 5F:
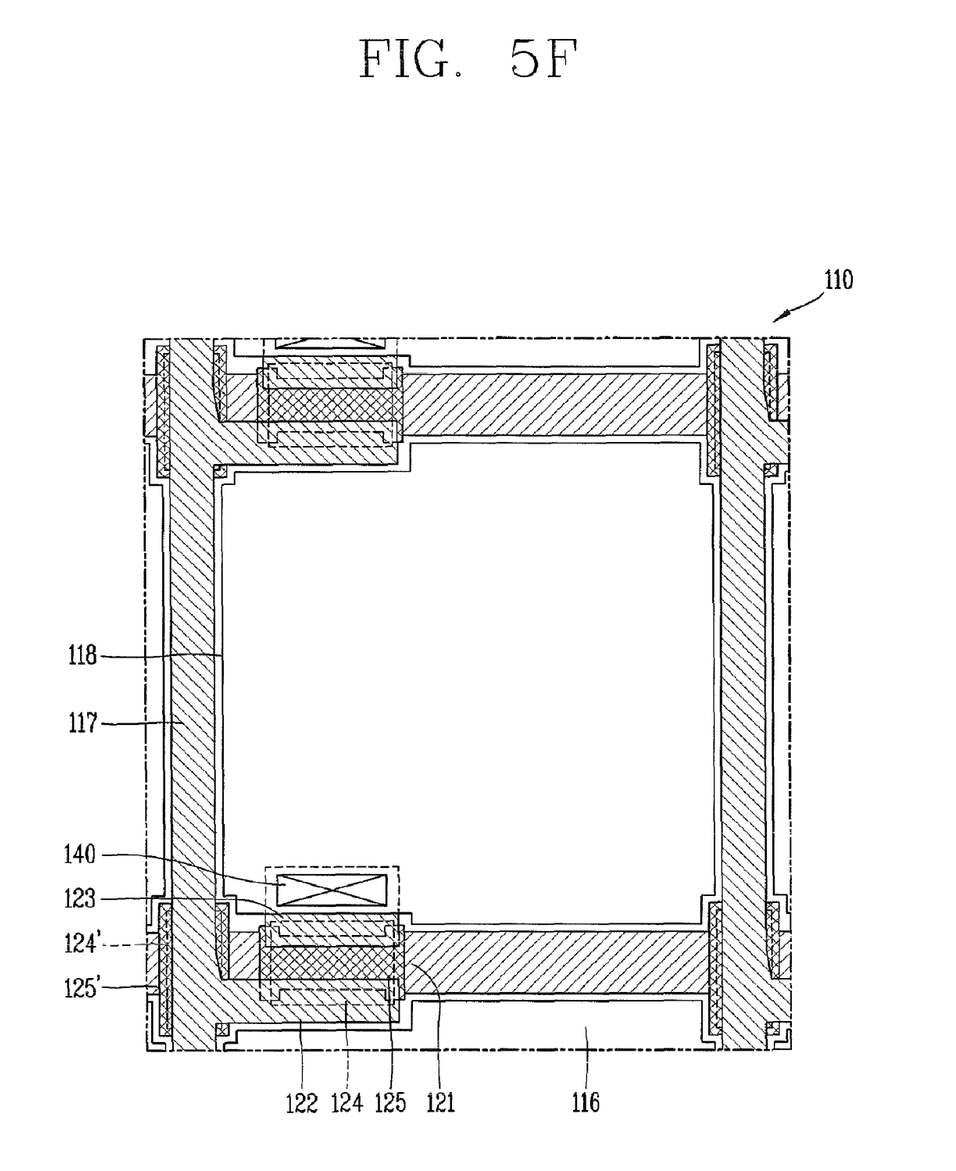
Figure 6F:
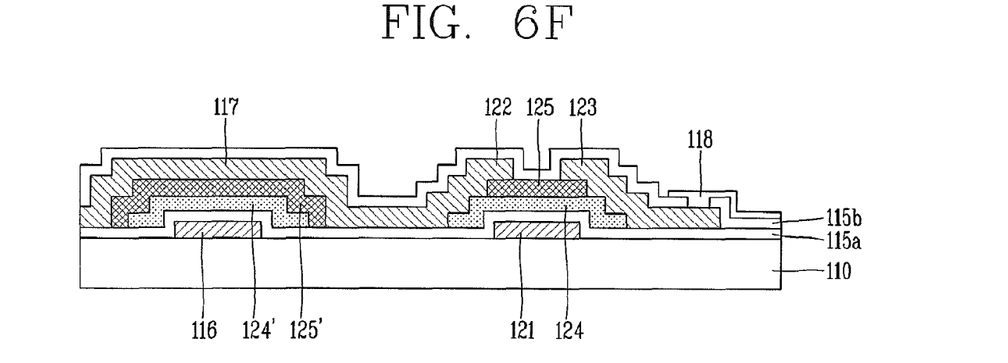

Referring to FIGS. 5F and 6F, a third conductive film is formed on the entire surface of the array substrate 110 having the passivation layer 115b, and undergoes a photolithography process (6$^{th}$ masking process) to be selectively removed, thereby forming a pixel electrode 118 which is electrically connected to the drain electrode 123 via the contact hole 140.

Here, the third conductive film may be made of a transparent conductive material having high transmittance, such as indium tin oxide (ITO), indium zinc oxide (IZO) or the like.

The thusly fabricated array substrate according to the embodiment of the present invention is then bonded to a color filter substrate to face each other by a sealant formed at an outer periphery of an image display region. Here, the color filter substrate includes a black matrix for preventing light leakage into the TFT, the gate line and the data line, and a color filter for defining red, green and blue colors.

Here, the bonding between the color filter substrate and the array substrate is implemented by an attachment key (not shown) formed either at the color filter substrate or at the array substrate.

The LCD device according to the embodiment of the present invention exemplarily illustrates a twisted nematic (TN) type LCD device in which liquid crystal molecules on the nematic are driven in a longitudinal direction with respect to a substrate, but may not be limited to the type. Alternatively, the present invention may be applicable to an in plane switching (IPS) type LCD device in which liquid crystal molecules are driven in a horizontal direction with respect to a substrate so as to improve an angle of view by more than 170°.

As described above, the present invention may be applied not only to the LCD device but also to other display devices fabricated using TFTs, for example, organic electroluminescent display devices in which an electroluminescent element is connected to a driving transistor.

Also, the present invention can advantageously be used for transparent electronic circuits or flexible displays by employing the amorphous zinc oxide based semiconductor material, which can be processed at a low temperature, as the active layer.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a liquid crystal display device comprising:
    forming a gate electrode and a gate line on an array substrate;
    forming a gate insulating layer on the array substrate with the gate electrode and the gate line formed thereon;
    forming an active layer on the gate electrode having the gate insulating layer formed thereon, the active layer made of an amorphous zinc oxide-based semiconductor;
    forming an etch stopper in a shape like "H" on the active layer, the etch stopper obscuring the active layer excluding a contact region;
    forming source and drain electrodes on the active layer, the source and drain electrodes being electrically connected to the contact region of the active layer, and forming a data line defining a pixel region by intersecting with the gate line;
    forming a passivation layer on the array substrate having the source and drain electrodes and the data line formed thereon;
    forming a contact hole for exposing a part of the drain electrode by removing a partial region of the passivation layer;
    forming a pixel electrode, the pixel electrode being electrically connected to the drain electrode via the contact hole; and
    attaching the array substrate and a color filter substrate in a facing manner.

2. The method of claim 1, wherein the etch stopper is made of an insulating layer, the insulating layer comprising silicon oxide and silicon nitride.

3. The method of claim 2, further comprising forming a semiconductor pattern on the gate line present on the intersection between the gate line and the data line, the semiconductor pattern made of the amorphous zinc oxide-based semiconductor.

4. The method of claim 3, further comprising forming an insulating layer pattern made of the insulating layer on the semiconductor pattern, the insulating layer pattern obscuring the semiconductor pattern and the gate line.

5. The method of claim 1, wherein the etch stopper is formed in the shape like "H" by etching upper and lower central portions thereof for connection between the active layer and the source and drain electrodes.

6. The method of claim 1, wherein the exposed contact region of the active layer experiences a surface treatment or thermal treatment to decrease resistance.

7. The method of claim 1, wherein the active layer is formed with a-IGZO semiconductor.

8. The method of claim 1, wherein the amorphous zinc oxide-based semiconductor layer is formed under the conditions that a deposition speed with respect to DC or RF sputtering is in the range of 1 to 200 Å/sec and an oxygen concentration in a reactive gas during sputtering is in the range of 1 to 40%, the conditions depending on process conditions.

9. A liquid crystal display device comprising:
    a gate electrode and a gate line formed on an array substrate;
    a gate insulating layer formed on the array substrate with the gate electrode and the gate line formed thereon;
    an active layer formed on the gate electrode having the gate insulating layer formed thereon, the active layer made of an amorphous zinc oxide-based semiconductor;

an etch stopper formed on the active layer in a shape like "H," the etch stopper obscuring the active layer excluding a contact region;

a data line formed on the active layer to define a pixel region by intersecting with the source and drain electrodes and the gate line electrically connected to the contact region of the active layer;

a passivation layer formed on the array substrate with the source and drain electrodes and the data line formed thereon;

a contact hole formed by removing a partial region of the passivation layer to expose a part of the drain electrode;

a pixel electrode electrically connected to the drain electrode via the contact hole; and a color filter substrate attached to the array substrate to face each other.

10. The device of claim 9, wherein the etch stopper is made of an insulating layer, the insulating layer comprising silicon oxide and silicon nitride.

11. The device of claim 10, further comprising a semiconductor pattern formed on the gate line present on the intersection between the gate line and the data line, the semiconductor pattern made of the amorphous zinc oxide-based semiconductor.

12. The device of claim 11, further comprising an insulating layer pattern formed on the semiconductor pattern to obscure the semiconductor pattern and the gate line, the insulating layer pattern made of the insulating layer.

13. The device of claim 9, wherein the etch stopper is formed in the shape like "H" by etching upper and lower central portions thereof for connection between the active layer and the source and drain electrodes.

14. The device of claim 9, wherein the active layer has an alignment margin of about 1.5 µm in a longitudinal direction of the gate electrode.

15. The device of claim 9, wherein the contact region of the active layer overlap with the gate electrode with a width of about 1.5 µm and simultaneously overlap with the source and drain electrodes with a width of about 3 µm.

16. The device of claim 9, wherein the "H" shaped etch stopper overlaps with the source and drain electrodes with a width of about 1.5 µm at a central portion thereof excluding right and left protruded portions thereof.

* * * * *